United States Patent
Chokshi et al.

(10) Patent No.: US 10,590,689 B2
(45) Date of Patent: Mar. 17, 2020

(54) DYNAMICALLY MOVABLE ROOM SEPARATOR

(71) Applicant: INTERNATIONAL BUSINESS MACHINES CORPORATION, Armonk, NY (US)

(72) Inventors: Risham Y. Chokshi, North Brunswick, NJ (US); Rhonda L. Childress, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 15/632,588

(22) Filed: Jun. 26, 2017

(65) Prior Publication Data

US 2018/0371819 A1 Dec. 27, 2018

(51) Int. Cl.
| | | |
|---|---|---|
| *E05F 15/60* | (2015.01) | |
| *E05F 15/605* | (2015.01) | |
| *E05F 15/635* | (2015.01) | |
| *E04B 2/74* | (2006.01) | |
| *H03K 17/79* | (2006.01) | |
| *H03K 17/945* | (2006.01) | |

(Continued)

(52) U.S. Cl.
CPC .......... *E05F 15/605* (2015.01); *E04B 2/7433* (2013.01); *E04B 2/827* (2013.01); *E05F 15/603* (2015.01); *E05F 15/632* (2015.01); *E05F 15/635* (2015.01); *E05F 15/73* (2015.01); *H03K 17/79* (2013.01); *H03K 17/945* (2013.01); *A47B 83/001* (2013.01); *E05Y 2600/13* (2013.01); *E05Y 2900/142* (2013.01)

(58) Field of Classification Search
CPC ..... E05F 15/605; E05F 15/603; E05F 15/632; E05F 15/635; E05F 15/73; E05F 15/40; G06T 9/006; E04B 2/827; E04B 2/7433; H03K 17/79; H03K 17/945; E05Y 2600/13; E05Y 2900/142; A47B 83/001; G08G 99/00
USPC ................................................. 52/71, 243.1
See application file for complete search history.

(56) References Cited

U.S. PATENT DOCUMENTS

| | | |
|---|---|---|
| 3,224,489 A | 12/1965 | Haberthier |
| 4,161,850 A | 7/1979 | Peterson et al. |

(Continued)

OTHER PUBLICATIONS

Mell et al., "The NIST Definition of Cloud Computing," U.S. Department of Commerce, National Institute of Standards and Technology, Sep. 2011, p. 1-7, Special Publication 800-145.

*Primary Examiner* — Beth A Stephan
(74) *Attorney, Agent, or Firm* — Michael O'Keefe

(57) ABSTRACT

Embodiments of the present invention disclose a method, computer system, and computer program product for a processor-implemented method for a movable wall process, the method including collecting a set of rules governing a size of a main room and a size of one or more sub-rooms comprising the main room, determining a starting position of a movable wall, where the movable wall separates the one or more sub-rooms, and where the starting position is determined by the set of rules, determining a location of one or more people, determining a required wall movement for the movable wall, wherein the required wall movement is determined by the set of rules and the location of one or more people, and moving the movable wall to a new position, based on the starting position and the required wall movement.

20 Claims, 6 Drawing Sheets

(51) Int. Cl.
*E05F 15/632* (2015.01)
*E05F 15/73* (2015.01)
*E04B 2/82* (2006.01)
*E05F 15/603* (2015.01)
*A47B 83/00* (2006.01)

(56) References Cited

U.S. PATENT DOCUMENTS

| | | |
|---|---|---|
| 6,912,429 B1 | 6/2005 | Bilger |
| 6,996,940 B2 | 2/2006 | Beasley |
| 7,228,664 B2 * | 6/2007 | Clark ..................... E04B 2/827 52/243.1 |
| 7,840,567 B2 * | 11/2010 | Childress ............... G06Q 10/02 707/748 |
| 8,833,001 B2 * | 9/2014 | Gardner .............. E04B 1/34384 52/64 |
| 8,983,675 B2 * | 3/2015 | Dawson ............... F24F 11/0001 700/300 |
| 9,644,366 B2 | 5/2017 | Timur |
| 10,196,815 B2 * | 2/2019 | Dickson .................. E04B 2/827 |
| 2004/0187401 A1 * | 9/2004 | Krestakos ............ A47B 83/001 52/79.1 |
| 2012/0124923 A1 * | 5/2012 | Goodman ................ E06B 5/164 52/232 |
| 2016/0173293 A1 | 6/2016 | Kennedy |
| 2016/0259339 A1 * | 9/2016 | High .......................... E01H 5/12 |
| 2017/0067983 A1 * | 3/2017 | Teicher ............... G07C 9/00126 |
| 2018/0202813 A1 * | 7/2018 | Belt ..................... G01C 21/005 |
| 2018/0260497 A1 * | 9/2018 | Vanker ................. G06F 17/5004 |
| 2019/0011268 A1 * | 1/2019 | Ashar .................. G01C 21/206 |
| 2019/0169843 A1 | 6/2019 | Timenes |

* cited by examiner

US 10,590,689 B2

DYNAMICALLY MOVABLE ROOM SEPARATOR

BACKGROUND

The present invention relates, generally, to the field of computing, and more particularly to controlling a mechanically movable room separator.

Room separators or dividers provide flexibility in setting up smaller rooms of various size within a large or main room. Using room separators allows multiple gatherings to take place independently. Room separators may be used for a conference, office space, sales events, service counters, and social gatherings, and rest rooms which may have separate rooms for women and men. A room separator also allows a large room to be used for small gatherings where a small number of people would be more comfortable in a reasonably proportioned room compared to the amount of people.

SUMMARY

Embodiments of the present invention disclose a method, computer system, and computer program product for a processor-implemented method for a movable wall process, the method including collecting a set of rules governing a size of a main room and a size of one or more sub-rooms comprising the main room, determining a starting position of a movable wall, where the movable wall separates the one or more sub-rooms, and where the starting position is determined by the set of rules, determining a location of one or more people, determining a required wall movement for the movable wall, wherein the required wall movement is determined by the set of rules and the location of one or more people, and moving the movable wall to the new position, based on the starting position and the required wall movement.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
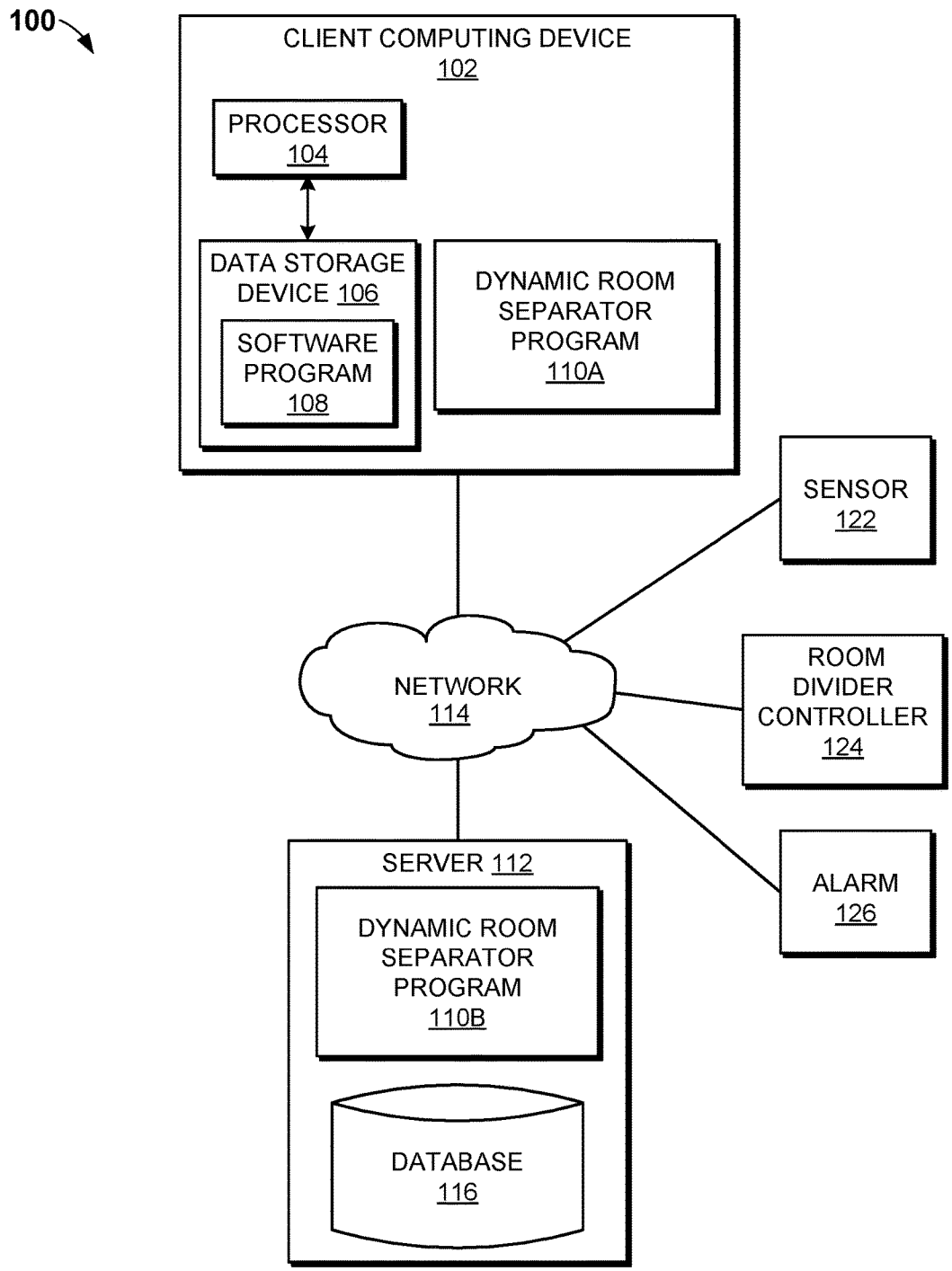
FIG. 1 illustrates an exemplary networked computer environment, in accordance with an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to the field of computing, and more particularly to controlling a mechanically movable room separator. The following described exemplary embodiments provide a system, method, and program product to, among other things, identify a number of people in one or more sub-rooms, a number of people waiting to enter a sub-room, take into account a set of rules regarding room usage, determine if a room divider which separates the one or more sub-rooms should be moved, and move the room divider. Therefore, the present embodiment has the capacity to improve the technical field of controlling a manually movable room divider by dynamically monitoring a movement of people and automatically moving the room divider without manual input. The room divider may be moved quietly and in a background of activity in each room without disturbing an on-going event. The number of people in the one or more sub-rooms may then be more comfortable and have an adequate amount of space per person.

As previously described, room separators or dividers provide flexibility in setting up rooms of various size within a large room. Using room separators allows multiple gatherings to take place independently. Room separators or wall separators may be used for a conference, event, office space, sales events, rest rooms, service counters, and social gatherings, such as a wedding. A room separator also allows a large room to be used for small gatherings where a small number of people would be more comfortable in a reasonably proportioned room compared to the amount of people.

The dynamic movement of people may not be accurately anticipated during an event which utilizes a large room divided into two or more smaller rooms. Manually re-positioning a room divider may take a long period of time and may be disruptive to activities occurring during the one or more events. Determining that a room divider is in need of movement, and determining the distance which the room divider should be moved, may take a period of time. Additionally, one or more workers may be required to manually move the wall, which may result in disruptive noise both from the workers and from the room divider movement. As such, it may be advantageous to, among other things, implement a system that dynamically identifies a room usage of each smaller room, and control movement of the room divider while not interfering with events occurring in each smaller room.

According to an embodiment, an Internet of Things (hereinafter "IOT") device may detect a location of individuals in one or more sub-rooms, waiting to enter a sub-room, or present in a geofence, through the use of a sensor. A device which is connected as an IOT device may be connected to the internet and may be enabled to send and receive data through the internet. A determination may be made whether a room divider needs to be repositioned, depending on a set of rules. An IOT device may move the room divider based on the determination.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method, and program product to dynamically control movement of a movable room separator, based on sensor driven determination of an amount of people on either side of the room separator.

FIG. 1 depicts an exemplary networked computer environment 100, according to an embodiment. The networked computer environment 100 may include a client computing device 102, a server 112, a sensor 122, a room divider controller 124, and an alarm 126, interconnected via a communication network 114. According to an implementation, the networked computer environment 100 may include a plurality of client computing devices 102, servers 112, sensors 122, room divider controllers 124, and alarms 126, of which only one of each is shown for illustrative brevity.

The communication network 114 may include various types of communication networks, such as a wide area network (WAN), local area network (LAN), a telecommunication network, a wireless network, a public switched network and/or a satellite network. The communication network 114 may include connections, such as wire, wireless communication links, or fiber optic cables. The communication network 114 may be used to connect devices to the IOT. It may be appreciated that FIG. 1 provides only an illustration of an implementation and does not imply any limitations with regard to the environments in which different embodiments may be implemented. Many modifications to the depicted environments may be made based on design and implementation requirements.

Client computing device 102 may include a processor 104 and a data storage device 106 that is enabled to host and run a software program 108 and a dynamic room separator program 110A and communicate with the server 112, the sensor 122, the room divider controller 124, and the alarm 126, via the communication network 114, in accordance with an embodiment of the invention. Client computing device 102 may be, for example, a mobile device, a telephone, a personal digital assistant, a netbook, a laptop computer, a tablet computer, a desktop computer, or any type of computing device capable of running a program and accessing a network. As will be discussed with reference to FIG. 5, the client computing device 102 may include internal components 502a and external components 504a, respectively.

The server 112 may be a laptop computer, netbook computer, personal computer (PC), a desktop computer, or any programmable electronic device or any network of programmable electronic devices capable of hosting and running a dynamic room separator program 110B and a database 116 and communicating with the client computing device 102, the sensor, the room divider controller 124, and the alarm 126, via the communication network 114, in accordance with embodiments of the invention. As will be discussed with reference to FIG. 5, the server 112 may include internal components 502b and external components 504b, respectively. The server 112 may also operate in a cloud computing service model, such as Software as a Service (SaaS), Platform as a Service (PaaS), or Infrastructure as a Service (IaaS). The server 112 may also be located in a cloud computing deployment model, such as a private cloud, community cloud, public cloud, or hybrid cloud.

The sensor 122 may be an Internet of Things (hereinafter "IOT") sensor, enabled to send and receive data through the communication network 114, for example communicate to and from the internet. The sensor 122 may be capable of identifying when an electronic device enters or leaves a particular area, presumably on or around a person, within a virtual geographic boundary, such as a geofence. The electronic device may be a mobile device such as a phone, laptop computer, exercise or activity monitor, or other electronic device. The sensor 122 may be an infrared light sensor, an optical sensor, a motion sensor, a laser sensor, a photoelectric sensor, a presence sensing sensor, a pressure sensitive floor mat, and other types of sensors. An infrared light sensor, or infrared sensor, may measure infrared light radiating from objects, which may be used to sense the presence or motion of people, animals, or other objects. An optical sensor may measure a physical quality of light and changes in the physical quality of light. A motion sensor may detect moving people and objects, and may contain an optical, microwave, or acoustic sensor. A laser sensor may use a laser beam to emit light in a straight line and can identify movement of people and objects across the laser beam. The photoelectric sensor, or photo eye, may use a light transmitter, for example an infrared light transmitter, and a photoelectric receiver to discover a distance, absence, or presence of an object. The pressure sensitive floor mat may identify when pressure is applied to the mat, and can be used to keep track of movement of people in and out of a room. The pressure sensitive floor mat may be at a doorway of a room, may cover an entire floor of a room, or may cover a waiting area outside of a room. The sensor 122 may be able to identify people standing, sitting, being held by other people, and in wheelchairs. Although only one sensor 122 is depicted, multiple sensors 122 may be implemented in the networked computer environment 100.

The room divider controller 124 may be a mechanical device capable of controlling movement of a physical room divider in at least one direction. In an embodiment, the room divider control 124 may control a mechanism controlling movement of a room divider, and may be connected to a room ceiling. The mechanism may contain wheels and pulleys, and be capable of moving a hanging room divider along a track.

The alarm 126 may be audio or sensory. The alarm 126 may include a message sign, a bell, a ringer, a light, an email, a text message, a vibration, or any type of alarm.

The sensor 122, the room divider controller 124, and the alarm 126, may be enabled to interface with the dynamic room separator program 110A, 110B, via the communication network 114.

According to an embodiment, the dynamic room separator program 110A, 110B may be a program capable of determining if a room divider should be repositioned, and moving the room divider accordingly. The dynamically movable room separator method is explained in further detail below with respect to FIGS. 2-4.

Figure 2:
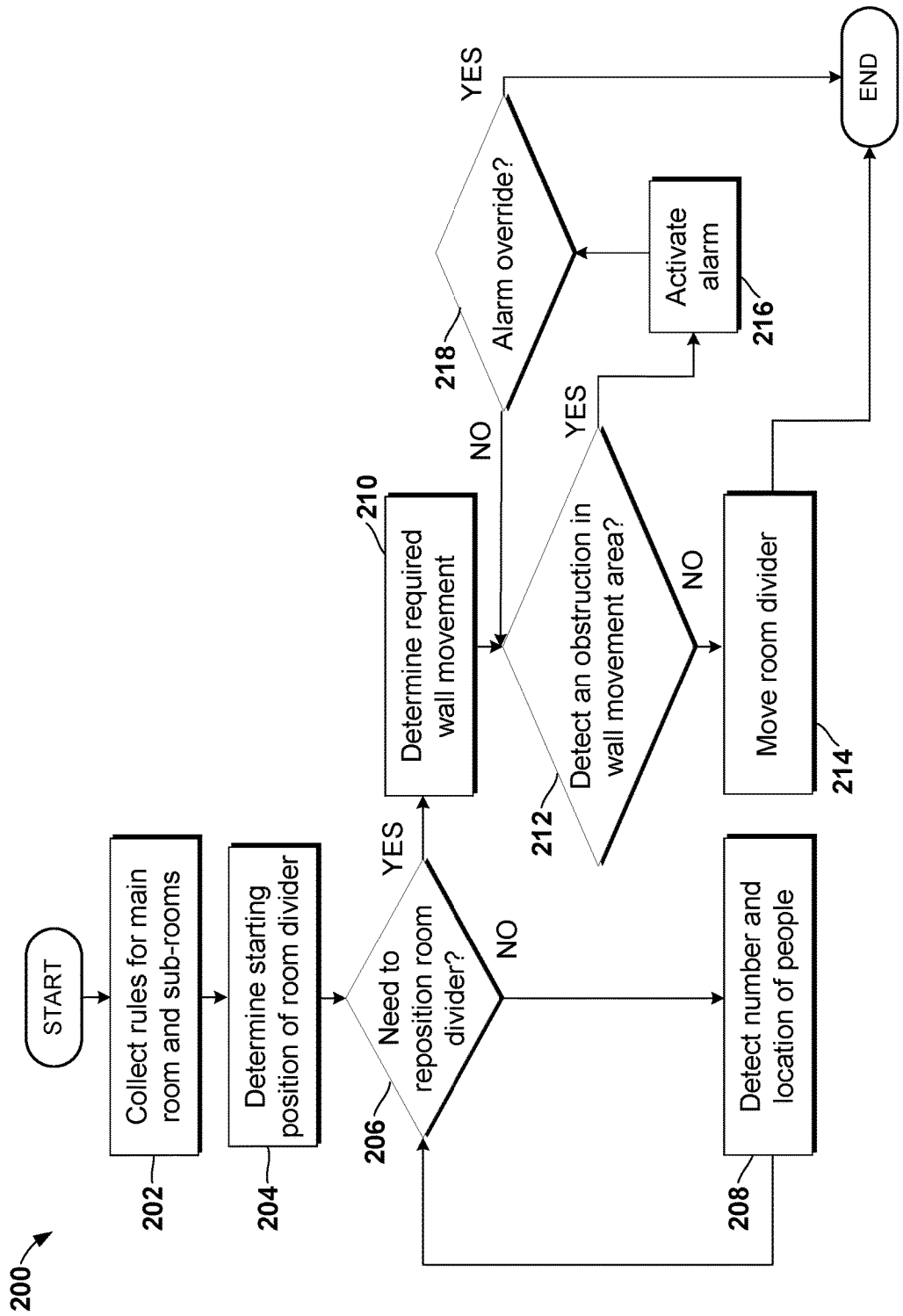
FIG. 2 is an operational flowchart illustrating a movable wall process, in accordance with an embodiment of the present invention.

FIG. 2 depicts an operational flowchart illustrating a movable wall process 200, according to an embodiment. A main room may have a room divider which divides or splits the main room into smaller rooms or sub-rooms, for example, room 1 and room 2.

At 202, the dynamic room separator program 110, 110B collects a set of rules for usage of the main room, and one or more sub-rooms, for example room 1 and room 2. The set of rules may contain a set of regulations governing a size of the main room and a size of the one or more sub-rooms. The set of rules may be used when determining a room size. The set of rules may include a minimum room size, a minimum allowable space per person, fire code regulations, an anticipated number of people attending an event, an event start time, an event end time, an anticipated number of people in the main room, and an anticipated number of people in each of the one or more sub-rooms, a number of people waiting in a queue to enter each of the one or more sub-rooms, a number of people in a larger geofence, a rate of a queue increase or decrease, a minimum frequency of wall movement, a size of each of the one or more sub-rooms, a type of room set up for the event, an amount and size of furniture, a billing rate, specifics of the billing rate, a first threshold, and other terms.

The size of the main room, and the size of a sub-room may be measured by a floor square footage. The minimum allowable space per person may depend on a number of people in the room, on the room size, and fire code regulations of an amount of people allowed in the room. The anticipated number of people attending an event may be determined by people's response to an event invitation. The minimum frequency of wall movement may be dynamically set. For example, the wall divider should not be moved more frequently than every ten minutes. The type of room set up may be, for example, theater seating, classroom seating, or banquet seating. The billing rate may specify if a specific size room was paid for during a duration of an event, if the room size could be modified, under what conditions a room size could be modified, if a room size change would result in a reduction of the billing rate, and other applicable terms of room rental. The first threshold may be in the set of rules and may be an occupancy rate above which there is more than enough room per person and there would be no need to increase a room size.

At 204, the dynamic room separator program 110A, 110B determines a starting position of a room divider in a main room. The room divider may be positioned prior to any people using the main room or sub-rooms. The room divider may divide or split the main room into one or more sub-rooms, for example, room 1 and room 2. The default position may determine the room divider position based on the set of rules, and by a detected number and location of people, if available. The set of rules are collected above in step 202. The number and location of people are determined in step 208, below. Alternatively, the default position may divide the main room into two equally sized rooms. For example, room 1 and room 2 may have the same floor square footage. The default position may divide the main room into two different size rooms. For example, room 1 may have a greater floor square footage than the floor square footage of room 2.

In an embodiment, there may be a conference which is using both room 1 and room 2. The conference may be billed for the use of both room 1 and room 2. An estimated number of people for a planned event in room 1 may be estimated for 100 people, while concurrently a planned even in room 2 may have an estimate of 50 people. In this example, the default position of the room divider may initially set room 1 to be twice as large as room 2.

At 206, the dynamic room separator program 110A, 110B determines if there is a need to reposition the room divider. The determination is made based on the set of rules, including an estimated usage of the one or more sub-rooms. Repositioning the room divider may result in a change of square footage of a sub-room, for example room 1 and room 2. In an embodiment, movement of the room divider may increase the square footage of room 1 while decreasing the square footage of room 2. Alternatively, the room divider may be moved to decrease the square footage of room 1, while increasing the size or square footage of room 2. Movement of the room divider may alternatively decrease the first room size, and increase the second room size. In an embodiment, a user may determine whether there is a need to reposition the room divider.

In an embodiment, if the beginning of a planned event is less than a first amount of minutes, or the ending of the planned event is less than a second amount of minutes, and depending on the set of rules, the dynamic room separator program 110A, 110B may determine that there is no need to reposition the room divider, and may continue to 208, below.

In an example, the first room may have an occupancy rate of 20 ft$^2$ per person, resulting from a first room size of 1000 ft$^2$, with 50 people in the first room, while the second room occupancy rate may be 10 ft$^2$ per person, resulting from a second room size of 500 ft$^2$, with 50 people in the second room. The difference between the first usage of 20 ft$^2$ per person and the second usage of 10 ft$^2$ per person, is 10 ft$^2$ per person. A determination may be made to move the room divider, based on the occupancy rates of room 1 and room 2, and the set of rules as collected at step 202.

In an embodiment, if both the first room and the second room have an occupancy rate above the first threshold, and based on the set of rules, the dynamic room separator program 110A, 110B may determine that there is no need to reposition the room divider, and may continue to 208, below.

In an example of the above embodiment, the first usage may be 20 ft$^2$ per person, resulting from a first room size of 1000 ft$^2$, with 50 people in the first room, while the second usage may be 30 ft$^2$ per person, resulting from a second room size of 3000 ft$^2$, with 100 people in the second room. A first threshold may be 15 ft$^2$ per person. Both the first usage and the second usage exceed the first threshold. Therefore, the room divider should not be moved. The amount of people in each room have a comfortable amount of space per person and there is no reason to move the room divider.

If the dynamic room separator program 110A, 110B determines there is no need to reposition the room divider at 206, then the dynamic room separator program 110A, 110B may continue to 208, to detect a number and location of people.

If the dynamic room separator program 110A, 110B determines there is a need to reposition the room divider at 206, the movable wall process 200 may continue to 210 to determine required wall movement.

At 208, the dynamic room separator program 110A, 110B detects a number and location of people. The sensor 122, as described above, may be used to detect a number of people each of the one or more sub-rooms, for example room 1 and room 2. The sensor 122 may detect a number of people in a queue for each of the one or more sub-rooms. The sensor 122 may also detect a location of people in a larger geofence, and may also determine a location of people who may have RSVP'd to an event in order to access a likelihood of them attending the event.

The sensor 122 may also be able to determine objects, animals, and other items in the main room and the one or more sub-rooms. There may be one or more sensors 122 in each of the one or more sub-rooms. There may be a sensor 122 outside of room 1 to determine a number of people entering room 1 and exiting room 1. Similarly, there may be a sensor 122 outside of room 2 to determine a number of people entering room 2 and exiting room 2. There may be a sensor 122 to determine a number of people in a queue or in a waiting area for room 1, and similarly for room 2. There may be a sensor 122 in a larger geofence area.

The sensor 122 may be mounted on a wall, a ceiling, or on a floor, of either room 1 or room 2. The sensor 122 may be mounted such that the sensor 122 does not interfere with movement of the room divider. For example, the sensor 122 may be recessed or place in a position to which the room divider does not move. The sensor 122 may provide dynamic feedback of the number and location of people.

At 210, the dynamic room separator program 110A, 110B determines a required wall movement, as a result of a positive determination at 208, that there is a need to reposition the room divider. The determination of the required wall movement may take into account the set of rules and the number and location of people. In an embodiment, a user may determine the required room divider movement.

In an example, the first room may have 50 people in a 200 square foot room, which is a first usage of 4 ft² per person while the second room may have 50 people in an 800 square foot room, which is a second usage of 16 ft² per person. The dynamic room separator program 110A, 110B, may determine the required wall movement, based on the set of rules, in order to have the usage of room 1 and room 2 become approximately equivalent. In this example, there should be two rooms of 500 square feet, and both room usages will be 10 ft² per person. Assuming the main room has a length of 20 feet, l=20 feet, room 1 original width of 10 feet, w1=10 feet, and room 2 original width of 40 feet, w2=40 ft. After the divider is moved, the resulting w1 will be 25 feet and the resulting w2 will be 25 feet. The divider should be moved 15 feet, increasing the size of room 1. This will result in a balancing of the usage of room 1 and room 2.

Next, at 212, the dynamic room separator program 110A, 110B, may determine if there is an obstruction in a required wall movement area. Input may be collected from the sensor 122 to help determine if there are any obstructions, such as people, animals or objects. The room divider cannot not be moved into an area where there in an obstruction, in order to avoid injury to a person or animal, or damage to an object, such as furniture or personal belongings. Additionally, the room divider may be made of a flexible material which can flex away from an obstruction, to reduce a chance of injury or damage.

In an embodiment, for example a rest room divided into a women's room and a men's room, for safety reasons, the entire rest room may be required to be empty during wall movement, per the set of rules, and an entrance door to each the women's room and the men's room may be locked during wall movement by the dynamic room separator program 110A, 110B.

If the dynamic room separator program 110A, 110B determines there is not an obstruction in the wall movement area, the movable wall process may continue to 214. If the dynamic room separator program 110A, 110B determines there is an obstruction in the wall movement area, the movable wall process may continue to 216, activate alarm.

At 214, the dynamic room separator program 110A, 110B, may move the room divider, by directing the room divider controller 124, as described above, to perform the room divider movement. Movement of the room divider will result in a change in size of one or more of the one or more sub-rooms. In an example, room 1 may increase in size, while room 2 may decrease in size, or alternatively room 1 may decrease in size while room 2 increases in size. The size of a room may refer to floor space. Following 214, the dynamic room separator program 110A, 110B, may end.

At 216, the dynamic room separator program 110A, 110B, may activate an alarm 126, as described above. There may be one or more alarms 126 in the main room and each of the one or more sub-rooms. The alarm 126 may alert people that there is an obstruction in the wall movement area and request that people move the obstruction if movement is allowed. The alarm 126 may alert people by a visual or sound alert. The alarm 126 may include a message screen requesting removal of the obstruction. The alarm 126 may be a text message, a phone call, or an email, to an organizer of an event, or to staff of a location where the event is held. The set of rules may determine the type, frequency, and duration of any alarms. There may be a manual override to activate the alarm 126 by an operator. In an embodiment, the alarm 126 may be activated by an operator by pushing a button. After 216, the dynamic room separator program 110A, 110B, may continue to 218, below.

In an embodiment, a display or a table of food may be in the wall movement area, which may be difficult to move, and the dynamic room separator program 110A, 110B may be configured such that the location of the display or table of food is not available for wall movement for an amount of time.

In an embodiment, a restroom may be divided into a women's rest room and a men's rest room, and wall movement may only occur when both the women's and the men's rest rooms are empty of people, per the set of rules. Prior to wall divider movement, the dynamic room separator program 110A, 110B may control movement of people in an out of the women's and the men's rest rooms by controlling a door lock to each room, allowing people to leave but not enter the room. The sensor 122 may identify a number and location of people, and a queue of people, in and around each room.

At 218, the dynamic room separator program 110A, 110B, may determine if the alarm should be overridden. The determination may be made based on the set of rules, for example, the alarm may time out after 5 minutes. The determination may be a manual override to the alarm. When the determination to override the alarm is yes, the dynamic room separator program 110A, 110B, may end. When the determination to override the alarm is no, the dynamic room separator program 110A, 110B, may continue to step 212, determine if there is an obstruction in the wall movement area.

In an embodiment, there may be more than one room divider, and more than 2 rooms within the main room.

In an embodiment, following move room divider 214, the dynamic room separator program 110A, 110B, may continue to 202, collect rules for main room and one or more sub-rooms, and run continuously. In an alternate embodiment, the dynamic room separator program 110A, 110B, may be run periodically, for example, every 15 minutes. In a further embodiment, the dynamic room separator program 110A, 110B, may between certain hours, for example, Monday to Friday, 8 A.M. to 6 P.M.

Figure 3:
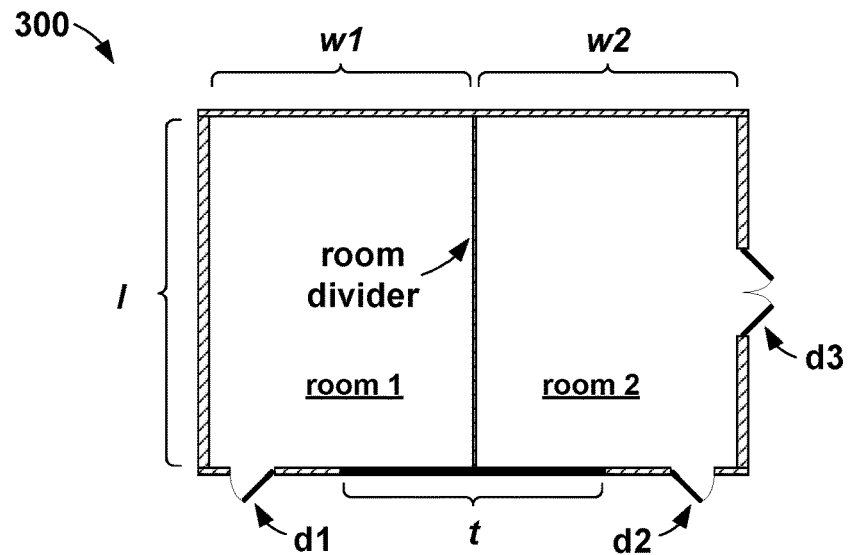
FIG. 3 is a functional block diagram of a main room floor plan, in accordance with an embodiment of the present invention.
Figure 4:
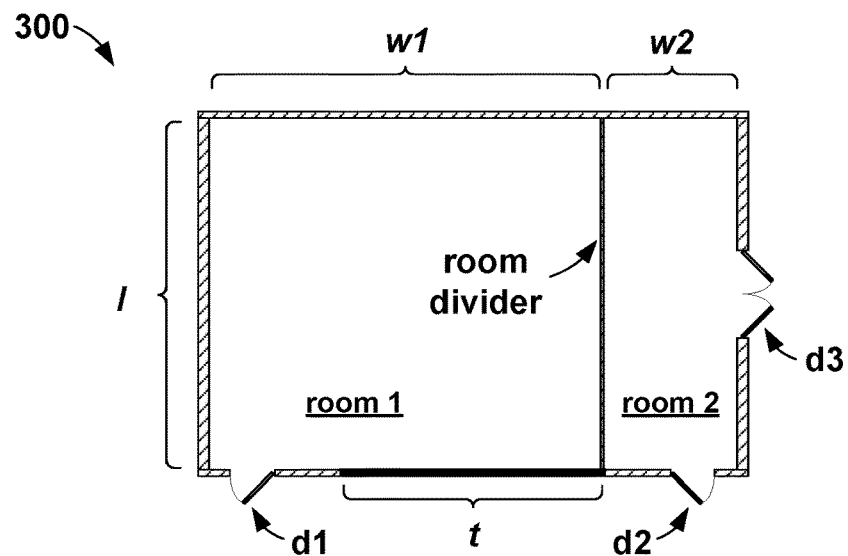
FIG. 4 is a functional block diagram of a main room floor plan, in accordance with an embodiment of the present invention.

FIGS. 3 and 4 each depict a functional block diagram of a main room floor 300, according to an embodiment. The main room floor 300 may include a room 1, a room 2, a room divider, a first door d1, a second door d2, and a third door, d3. The main room floor 300 may have a length of l. Room 1 may have a width of w1, and room 2 may have a width of w2. The room divider may be able to move in a direction parallel to l, and perpendicular to both w1 and w2, along a track t. In an embodiment, d1 may be in room 1, while d2 and d3 are in room 2. A main room size may be determined by multiplying l with a sum of w1 plus w2. A first room size may be determined by multiplying l and w1. A second room size may be determined by multiplying l and w2. The room size may be surface square feet.

FIG. 3 is an embodiment of the main room floor 300 with the room divider in a default position. In the default position, the first room size and the second room size are substantially equal. The room divider is in a center position along the track t.

FIG. 4 is an embodiment of the main room floor 300 with the room divider in a first position along the track t, resulting in the first room size being greater than the second room size.

As shown in FIGS. 3, and 4, there is a minimum size and a maximum size of room 1, along with a minimum size and a maximum size of room 2, depending on a position and length of the track t.

An alternate embodiment may include a main room which is a rest room which includes a ladies room and a men's room. The main room may have a set of sinks and a set of private stalls. A room divider may be able to divide the main room and be able to change an amount of sinks and private stalls in the ladies room and the men's room. For example, the set of private stalls have a common size partial wall between them along one side of the main room, and the set of sinks have a common size partial wall between then along the other side of the main room. The room divider may move on a track on a ceiling and be positioned across the main room between a wall of the partial wall between a first and second private stall, and a wall of the partial wall between a first and second sink. The set of rules may determine a minimum number of ladies private stalls and sinks, and a minimum number of men's private stalls and sinks. Specifically, in this example, the main room may have 10 private stalls and sinks. In a first setup, the room divider is positioned such that there are 7 private stalls and sinks in the ladies room and 3 private stalls and sinks in the men's room. The determination of required wall movement may take into account the set of rules and a number of people in queue for each the ladies and the men's rooms.

An alternate embodiment may be a main room which is a hotel room that may be configurable as one room, or as a two bedroom suite. The determination of required wall movement may take into account the set of rules and a type of reservation made, either single room or two bedroom suite. The movable wall may be hidden, or concealing along a ceiling, a floor, or a wall of the hotel room when not in use.

An alternate embodiment may be where is a service counter may be considered a main room. The service counter may be configurable with a number of service desks which are self-serve for a customer and a number of service desks which are serviced by an employee assisting a customer. The determination of the number of self-serve desks and service desks may be based on the set of rules, an amount of available employees, a time of day, a day of the week, a queue for each, and other rules. For example, a configuration for a service counter for an airline in an airport may take into account a flight schedule.

It may be appreciated that FIGS. 1-4 provides an illustration of an implementation and does not imply any limitations with regard to how different embodiments may be implemented. Many modifications to the depicted environments may be made based on design and implementation requirements.

Figure 5:
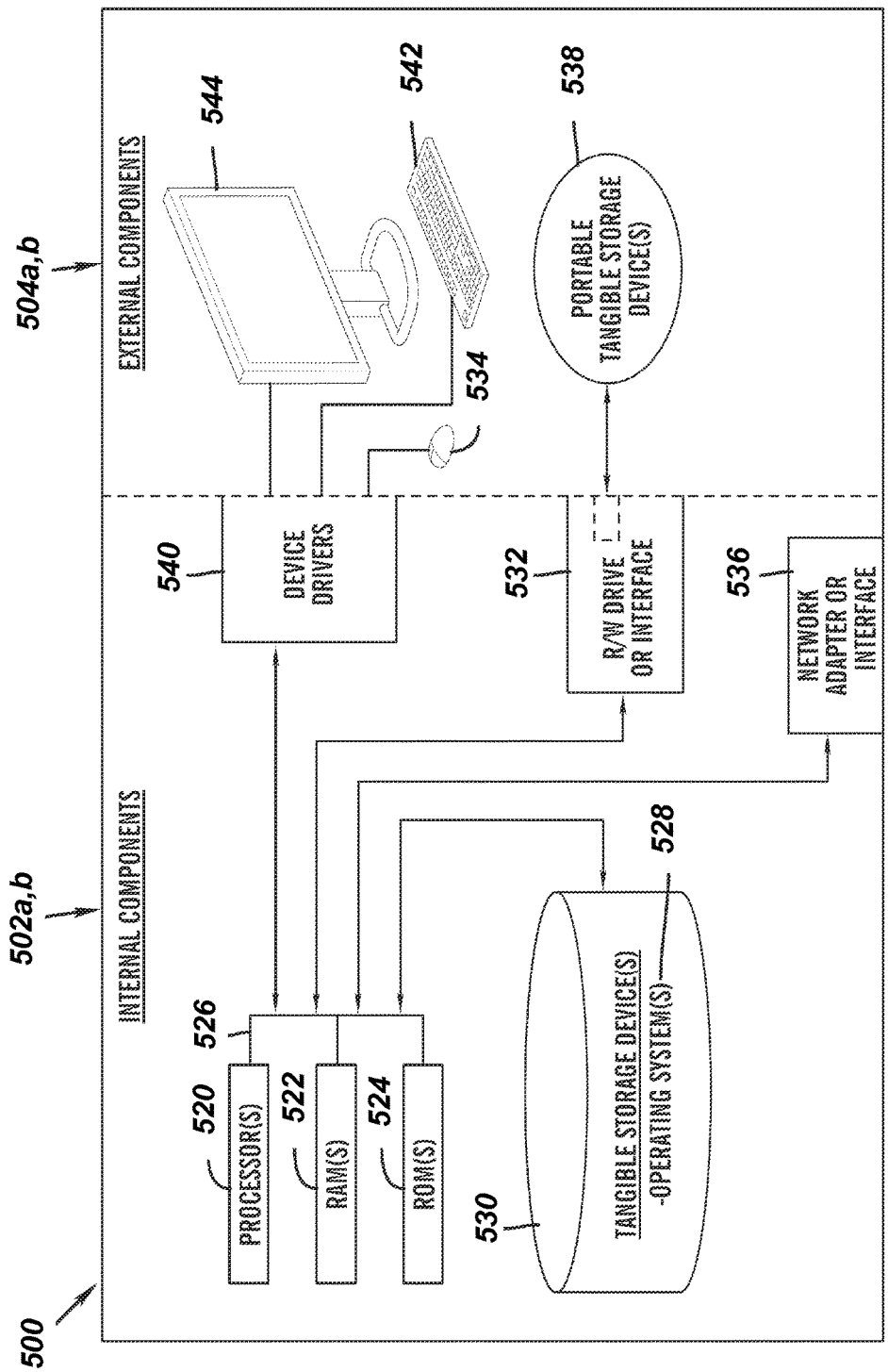
FIG. 5 is a block diagram of internal and external components of computers and servers depicted in FIG. 1, in accordance with an embodiment of the present invention.

FIG. 5 is a block diagram 500 of internal 502a,b, and external components 504a,b, of the client computing device 102 and the server 112 depicted in FIG. 1 in accordance with an embodiment of the present invention. It should be appreciated that FIG. 5 provides only an illustration of one implementation and does not imply any limitations with regard to the environments in which different embodiments may be implemented. Many modifications to the depicted environments may be made based on design and implementation requirements.

The data processing system 502a,b, and 504a,b, is representative of any electronic device capable of executing machine-readable program instructions. The data processing system 502, 504 may be representative of a smart phone, a computer system, PDA, or other electronic devices. Examples of computing systems, environments, and/or configurations that may represented by the data processing system 502a,b, and 504a,b, include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

The client computing device 102 and the server 112 may include respective sets of internal components 502a,b and external components 504a,b, illustrated in FIG. 5. Each of the sets of internal components 502 include one or more processors 520, one or more computer-readable RAMs 522, and one or more computer-readable ROMs 524 on one or more buses 526, and one or more operating systems 528 and one or more computer-readable tangible storage devices 530. The one or more operating systems 528, the software program 108 and the dynamic room separator program 110A in the client computing device 102, and the dynamic room separator program 110B in the server 112 are stored on one or more of the respective computer-readable tangible storage devices 530 for execution by one or more of the respective processors 520 via one or more of the respective RAMs 522 (which typically include cache memory). In the embodiment illustrated in FIG. 5, each of the computer-readable tangible storage devices 530 is a magnetic disk storage device of an internal hard drive. Alternatively, each of the computer-readable tangible storage devices 530 is a semiconductor storage device such as ROM 524, EPROM, flash memory or any other computer-readable tangible storage device that can store a computer program and digital information.

Each set of internal components 502a,b also includes a R/W drive or interface 532 to read from and write to one or more portable computer-readable tangible storage devices 538 such as a CD-ROM, DVD, memory stick, magnetic tape, magnetic disk, optical disk or semiconductor storage device. A software program, such as the dynamic room separator program 110A, 110B, can be stored on one or more of the respective portable computer-readable tangible storage devices 538, read via the respective R/W drive or interface 532, and loaded into the respective hard drive 530.

Each set of internal components 502 a,b also includes network adapters or interfaces 536 such as a TCP/IP adapter cards, wireless Wi-Fi interface cards, or 3G or 4G wireless interface cards or other wired or wireless communication links. The software program 108 and the dynamic room separator program 110A in the client computing device 102 and the dynamic room separator program 110B in the server 112 can be downloaded to the client computing device 102 and the server 112 from an external computer via a network (for example, the Internet, a local area network or other, wide area network) and respective network adapters or interfaces 536. From the network adapters or interfaces 536, the software program 108 and the dynamic room separator program 110A in the client computing device 102 and the dynamic room separator program 110B in the server 112 are loaded into the respective hard drive 530. The network may comprise copper wires, optical fibers, wireless transmission, routers, firewalls, switches, gateway computers and/or edge servers.

Each of the sets of external components 504a,b can include a computer display monitor 544, a keyboard 542, and a computer mouse 534. External components 504a,b can also include touch screens, virtual keyboards, touch pads, pointing devices, and other human interface devices. Each of the sets of internal components 502a,b also includes device drivers 540 to interface to the computer display monitor 544, the keyboard 542, and the computer mouse 534. The device drivers 540, R/W drive or interface 532, and network adapter or interface 536 comprise hardware and software (stored in storage device 530 and/or ROM 524).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 6:
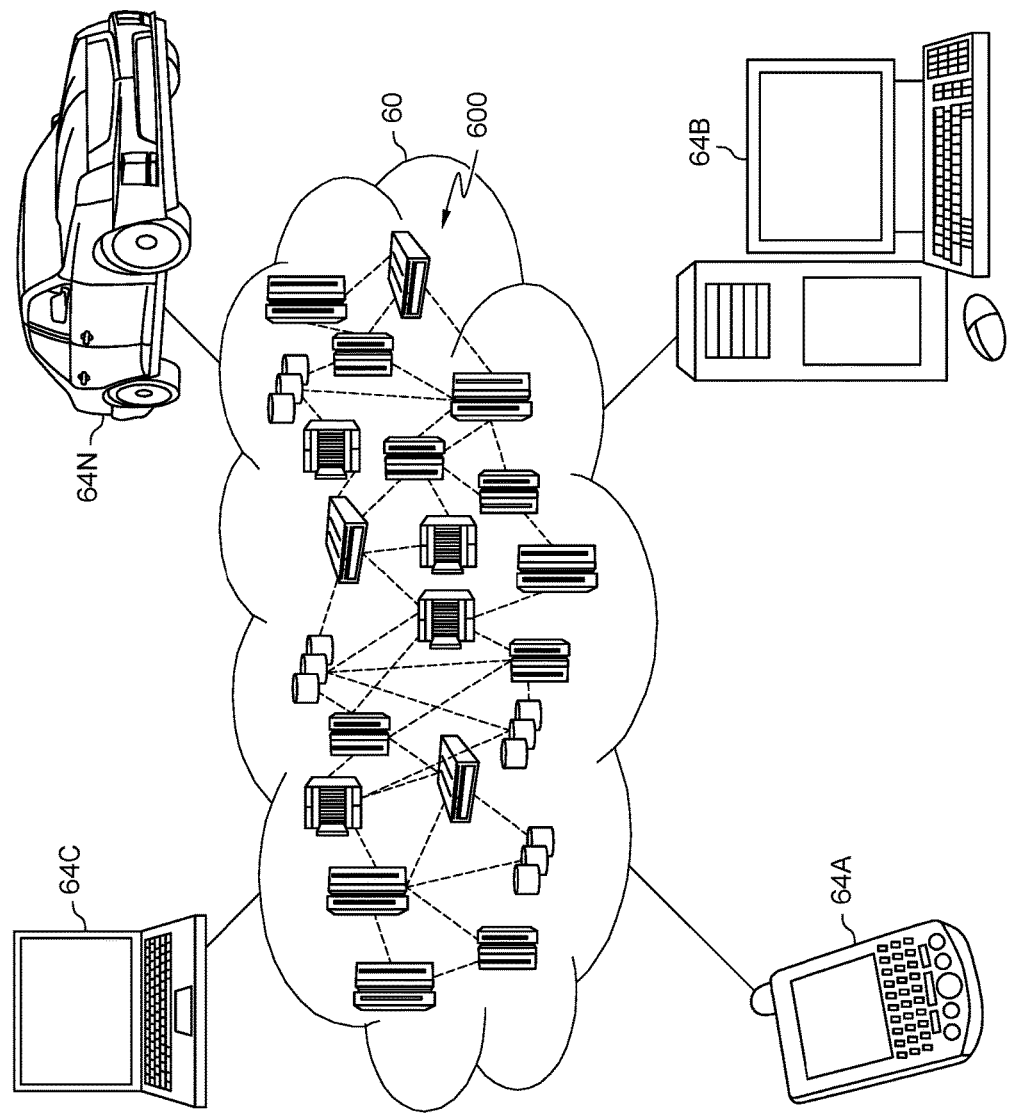
FIG. 6 depicts a cloud computing environment, in accordance with an embodiment of the present invention.

Referring now to FIG. 6, illustrative cloud computing environment 60 is depicted. As shown, cloud computing environment 60 comprises one or more cloud computing nodes 600 with which local computing devices used by cloud consumers, such as, for example, personal digital assistant (PDA) or cellular telephone 64A, desktop computer 64B, laptop computer 64C, and/or automobile computer system 64N may communicate. Nodes 600 may communicate with one another. They may be grouped (not shown) physically or virtually, in one or more networks, such as Private, Community, Public, or Hybrid clouds as described hereinabove, or a combination thereof. This allows cloud computing environment 60 to offer infrastructure, platforms and/or software as services for which a cloud consumer does not need to maintain resources on a local computing device. It is understood that the types of computing devices 64A-N shown in FIG. 6 are intended to be illustrative only and that computing nodes 600 and cloud computing environment 60 can communicate with any type of computerized device over any type of network and/or network addressable connection (e.g., using a web browser).

Figure 7:
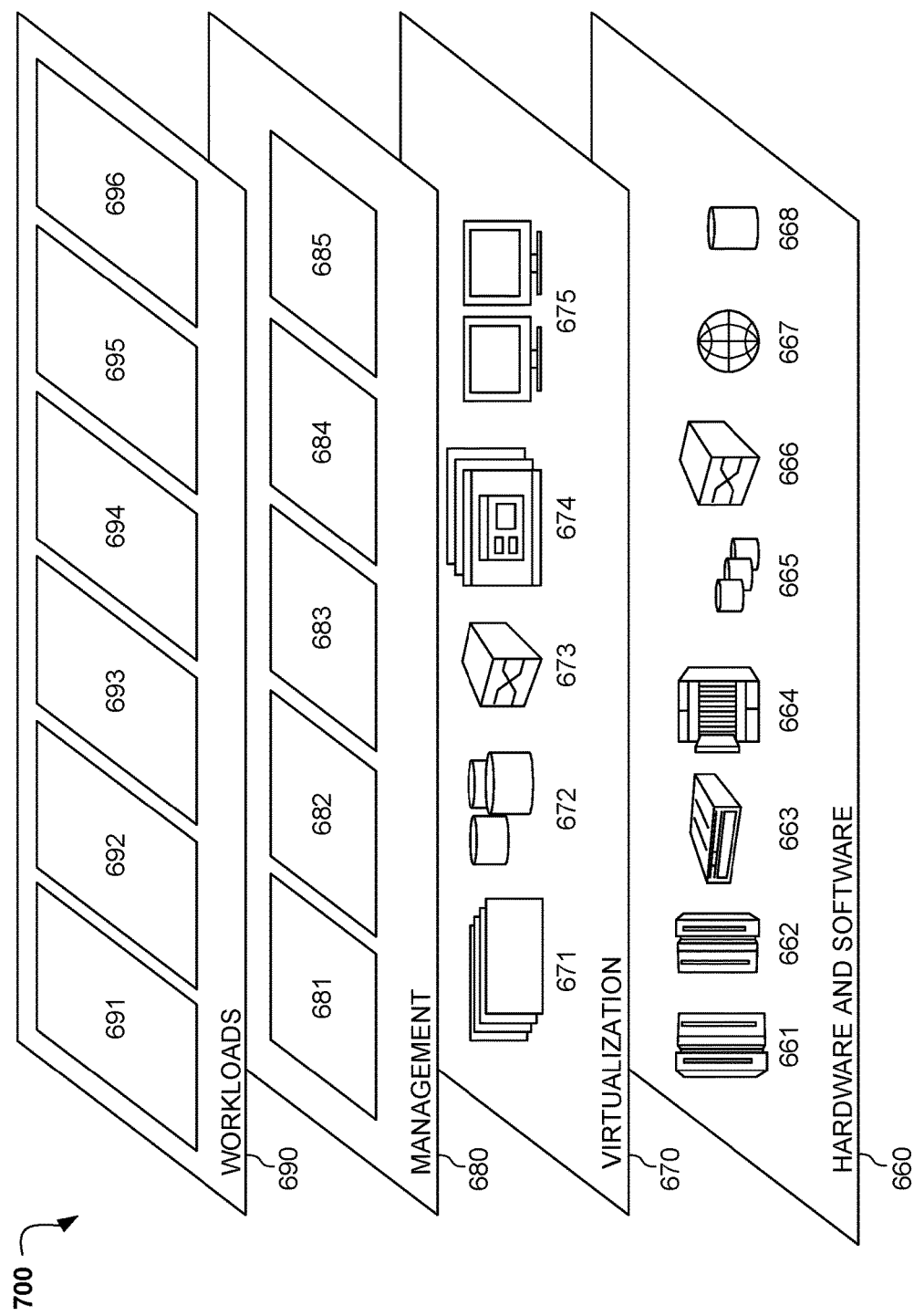
FIG. 7 depicts abstraction model layers, in accordance with an embodiment of the present invention.

Referring now to FIG. 7, a set of functional abstraction layers 700 provided by cloud computing environment 60 is shown. It should be understood in advance that the components, layers, and functions shown in FIG. 7 are intended to be illustrative only and embodiments of the invention are not limited thereto. As depicted, the following layers and corresponding functions are provided:

Hardware and software layer 660 includes hardware and software components. Examples of hardware components include: mainframes 661; RISC (Reduced Instruction Set Computer) architecture based servers 662; servers 663; blade servers 664; storage devices 665; and networks and networking components 666. In some embodiments, software components include network application server software 667 and database software 668.

Virtualization layer 670 provides an abstraction layer from which the following examples of virtual entities may be provided: virtual servers 671; virtual storage 672; virtual networks 673, including virtual private networks; virtual applications and operating systems 674; and virtual clients 675.

In an example, management layer 680 may provide the functions described below. Resource provisioning 681 provides dynamic procurement of computing resources and other resources that are utilized to perform tasks within the cloud computing environment. Metering and Pricing 682 provide cost tracking as resources are utilized within the cloud computing environment, and billing or invoicing for consumption of these resources. In an example, these resources may comprise application software licenses. Security provides identity verification for cloud consumers and tasks, as well as protection for data and other resources. User portal 683 provides access to the cloud computing environment for consumers and system administrators. Service level management 684 provides cloud computing resource allocation and management such that required service levels are met. Service Level Agreement (SLA) planning and fulfillment 685 provide pre-arrangement for, and procurement of, cloud computing resources for which a future requirement is anticipated in accordance with an SLA.

Workloads layer 690 provides examples of functionality for which the cloud computing environment may be utilized. Examples of workloads and functions which may be provided from this layer include: mapping and navigation 691; software development and lifecycle management 692; virtual classroom education delivery 693; data analytics processing 694; transaction processing 695; and dynamic wall movement control 696. Dynamic wall movement control 696 may relate to analyzing a number of individuals on two sides of a room divider, determine if the room divider should be moved, and control movement of the room divider.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-implemented method for a movable wall process, the method comprising:
   collecting a set of rules governing a size of a main room and a size of one or more sub-rooms comprising the main room;
   determining a starting position of a movable wall, wherein the movable wall separates the one or more sub-rooms, and wherein the starting position is determined by the set of rules;
   determining a location of one or more people;
   determining a required wall movement for the movable wall, wherein the required wall movement is determined by the set of rules and the location of one or more people; and
   moving the movable wall to a new position, based on the starting position and the required wall movement.

2. The method according to claim 1, further comprising:
   determining an obstruction in an area of the required wall movement; and
   activating an alarm, wherein the alarm identifies the obstruction.

3. The method according to claim 2, further comprising:
   manually overriding the alarm by a user.

4. The method according to claim 1, wherein the set of rules is selected from a group consisting of: a minimum room size, a minimum allowable space per person, a fire code regulation, an anticipated number of people attending an event, an event start time, an event end time, an anticipated number of people in the main room, an anticipated number of people in each of the one or more sub-rooms, a number of people waiting in a queue to enter each of the one or more sub-rooms, a number of people in a larger geofence, a rate of a queue increase, a rate of queue decrease, a minimum frequency of wall movement, a size of each of the one or more sub-rooms, a type of room set up for the event, a size of furniture in the main room and each of the one or more sub-rooms, a billing rate, and an occupancy rate above which there is more than enough room per person and there would be no need to increase a room size.

5. The method according to claim 1, wherein determining the location of one or more people comprises receiving input from a sensor, wherein the sensor is selected from a group consisting of: an infrared light sensor, an optical sensor, a motion sensor, a photoelectric sensor, a presence sensing sensor, and a laser sensor.

6. The method according to claim 2, wherein the alarm is selected from a group consisting of: a visual alarm, an audio alarm, a text message, a phone call, and an email.

7. The method according to claim 1, wherein the main room is a restroom and a first sub-room is a women's restroom and a second sub-room is a men's restroom.

8. The method according to claim 1, wherein moving the movable wall further comprises sending instructions to a movable wall controller.

9. A computer system for a movable wall process, the computer system comprising:
   one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
   program instructions to collect a set of rules governing a size of a main room and a size of one or more sub-rooms comprising the main room;
   program instructions to determine a starting position of a movable wall, wherein the movable wall separates the one or more sub-rooms, and wherein the starting position is determined by the set of rules;

program instructions to determine a location of one or more people;

program instructions to determine a required wall movement for the movable wall, wherein the required wall movement is determined by the set of rules and the location of one or more people; and program instructions to move the movable wall to a new position, based on the starting position and the required wall movement.

10. The computer system according to claim 9, further comprising:

program instructions to determine an obstruction in an area of the required wall movement; and program instructions to activate an alarm, wherein the alarm identifies the obstruction.

11. The computer system according to claim 10, further comprising:

program instructions to manually override the alarm by a user.

12. The computer system according to claim 9, wherein the set of rules is selected from a group consisting of: a minimum room size, a minimum allowable space per person, a fire code regulation, an anticipated number of people attending an event, an event start time, an event end time, an anticipated number of people in the main room, an anticipated number of people in each of the one or more sub-rooms, a number of people waiting in a queue to enter each of the one or more sub-rooms, a number of people in a larger geofence, a rate of a queue increase, a rate of queue decrease, a minimum frequency of wall movement, a size of each of the one or more sub-rooms, a type of room set up for the event, a size of furniture in the main room and each of the one or more sub-rooms, a billing rate, and an occupancy rate above which there is more than enough room per person and there would be no need to increase a room size.

13. The computer system according to claim 9, wherein program instructions to determine the location of one or more people comprises program instructions to receive input from a sensor, wherein the sensor is selected from a group consisting of: an infrared light sensor, an optical sensor, a motion sensor, a photoelectric sensor, a presence sensing sensor, and a laser sensor.

14. The computer system according to claim 9, wherein program instructions to move the movable wall further comprises program instructions to send instructions to a movable wall controller.

15. A computer program product for a movable wall process the computer program product comprising:

one or more computer-readable tangible storage medium and program instructions stored on at least one of the one or more tangible storage medium, the program instructions executable by a processor, the program instructions comprising:

program instructions to determine program instructions to collect a set of rules governing a size of a main room and a size of one or more sub-rooms comprising the main room;

program instructions to determine a starting position of a movable wall, wherein the movable wall separates the one or more sub-rooms, and wherein the starting position is determined by the set of rules;

program instructions to determine a location of one or more people;

program instructions to determine a required wall movement for the movable wall, wherein the required wall movement is determined by the set of rules and the location of one or more people; and program instructions to move the movable wall to the new position, based on the starting position and the required wall movement.

16. The computer program product according to claim 15, further comprising:

program instructions to determine an obstruction in an area of the required wall movement; and program instructions to activate an alarm, wherein the alarm identifies the obstruction.

17. The computer program product according to claim 16, further comprising:

program instructions to manually override the alarm by a user.

18. The computer program product according to claim 15, wherein the set of rules is selected from a group consisting of: a minimum room size, a minimum allowable space per person, a fire code regulation, an anticipated number of people attending an event, an event start time, an event end time, an anticipated number of people in the main room, an anticipated number of people in each of the one or more sub-rooms, a number of people waiting in a queue to enter each of the one or more sub-rooms, a number of people in a larger geofence, a rate of a queue increase, a rate of queue decrease, a minimum frequency of wall movement, a size of each of the one or more sub-rooms, a type of room set up for the event, a size of furniture in the main room and each of the one or more sub-rooms, a billing rate, and an occupancy rate above which there is more than enough room per person and there would be no need to increase a room size.

19. The computer program product according to claim 15, wherein program instructions to determine the location of one or more people comprises program instructions to receive input from a sensor, wherein the sensor is selected from a group consisting of: an infrared light sensor, an optical sensor, a motion sensor, a photoelectric sensor, a presence sensing sensor, and a laser sensor.

20. The computer program product according to claim 15, wherein program instructions to move the movable wall further comprises program instructions to send instructions to a movable wall controller.

* * * * *